United States Patent [19]
Kirchner et al.

[11] Patent Number: 6,093,280
[45] Date of Patent: Jul. 25, 2000

[54] CHEMICAL-MECHANICAL POLISHING PAD CONDITIONING SYSTEMS

[75] Inventors: Eric J. Kirchner, Weston, Mass.; Jayashree Kalpathy-Cramer, West Linn, Oreg.

[73] Assignee: LSI Logic Corporation, Milpitas, Calif.

[21] Appl. No.: 08/912,597

[22] Filed: Aug. 18, 1997

[51] Int. Cl.$^7$ .................................................... C23F 1/02
[52] U.S. Cl. ............................ 156/345; 451/285; 451/5; 451/41; 451/443
[58] Field of Search ............................ 156/345; 451/285, 451/5, 41, 443

[56] References Cited

U.S. PATENT DOCUMENTS

| | | | |
|---|---|---|---|
| 4,558,542 | 12/1985 | Marton | 51/358 |
| 5,081,051 | 1/1992 | Mattingly et al. | 437/10 |
| 5,216,843 | 6/1993 | Breivogel et al. | 51/131.1 |
| 5,245,790 | 9/1993 | Jerbic . | |
| 5,265,378 | 11/1993 | Rostoker . | |
| 5,310,455 | 5/1994 | Pasch et al. . | |
| 5,321,304 | 6/1994 | Rostoker . | |
| 5,389,194 | 2/1995 | Rostoker et al. . | |
| 5,403,228 | 4/1995 | Pasch . | |
| 5,486,131 | 1/1996 | Cesna et al. | 451/56 |
| 5,516,400 | 5/1996 | Pasch et al. . | |
| 5,536,202 | 7/1996 | Appel | 451/285 |
| 5,547,417 | 8/1996 | Breivogel et al. | 451/58 |
| 5,595,526 | 1/1997 | Yau et al. | 451/8 |
| 5,597,443 | 1/1997 | Hempel | 156/636.1 |
| 5,624,304 | 4/1997 | Pasch et al. . | |
| 5,626,715 | 5/1997 | Rostoker . | |
| 5,667,433 | 9/1997 | Mallon . | |
| 5,823,854 | 10/1998 | Chen | 451/9 |
| 5,861,055 | 1/1999 | Allman et al. . | |
| 5,865,666 | 2/1999 | Nagahara . | |
| 5,868,608 | 2/1999 | Allman et al. . | |
| 5,882,251 | 3/1999 | Berman et al. . | |
| 5,885,147 | 3/1999 | Kreager et al. | 451/443 |
| 5,888,120 | 3/1999 | Doran . | |
| 5,893,756 | 4/1999 | Berman et al. . | |
| 5,921,856 | 7/1999 | Zimmer | 451/539 |
| 5,948,697 | 9/1999 | Hata . | |
| 5,957,757 | 9/1999 | Berman . | |

*Primary Examiner*—Richard Bueker
*Assistant Examiner*—Norca L. Torres
*Attorney, Agent, or Firm*—Beyer Weaver & Thomas

[57] ABSTRACT

A conditioning wafer for conditioning a polishing pad employed in chemical-mechanical polishing of an integrated circuit substrate is described. The conditioning wafer includes a disk having a conditioning surface and a plurality of abrasive particles secured on the conditioning surface of the disk. Furthermore, the abrasive particles engage with the polishing pad when the conditioning wafer contacts the polishing pad during conditioning of the polishing pad.

34 Claims, 4 Drawing Sheets

CHEMICAL-MECHANICAL POLISHING PAD CONDITIONING SYSTEMS

BACKGROUND OF THE INVENTION

The present invention relates to conditioning of a polishing pad employed in chemical-mechanical polishing (CMP). More particularly, the present invention relates to a conditioning wafer and an automatic polishing pad conditioning process using the conditioning wafer.

Chemical mechanical polishing (sometimes referred to as "CMP") typically involves mounting a wafer faced down on a holder and rotating the wafer face against a polishing pad mounted on a platen, which in turn is rotating or is in an orbital state. A slurry containing a chemical that chemically interacts with the facing wafer layer and an abrasive that physically removes that layer is flowed between the wafer and the polishing pad or on the pad near the wafer. In semiconductor wafer fabrication, this technique is commonly applied to planarize various wafer layers such as dielectric layers, metallization layers, etc.

Unfortunately after polishing on the same polishing pad over a period of time, the polishing pad suffers from "pad glazing." As is well known in the art, pad glazing results when the particles eroded from the wafer surface along with the abrasives in the slurry tend to glaze or accumulate over the polishing pad. Pad glazing is particularly pronounced during CMP an oxide layer such as a silicon dioxide layer (hereinafter referred to as "oxide CMP"). By way of example, during oxide CMP, eroded silicon dioxide particulate residue along with the abrasives in the slurry glaze the polishing pad. Pad glazing is undesirable because it reduces the polishing rate of the wafer surface and produces a non-uniformly polished wafer surface due to uneven removal of the glaze, e.g., the peripheral region of the wafer surface may not be polished to the same extent as the center region of the wafer surface or vice-versa.

One way of achieving and maintaining a high and stable polishing rate is by conditioning the polishing pad on a regular basis, i.e. either every time after a wafer has been polished or simultaneously during wafer CMP. FIG. 1A shows a top view of a conditioning sub-assembly 100 including a polishing pad 102. Conditioning sub-assembly 100 also includes a conditioning arm 104 that is disposed above polishing pad 102 and capable of pivoting about a pivoting point 106. Conditioning arm 104, as shown in FIG. 1A, is typically longer in length than a diameter of the polishing pad. For illustration purposes, FIG. 1B shows a bottom view of conditioning arm 104 of FIG. 1A. The bottom surface of conditioning arm 104 includes a plurality of diamond abrasive particles 108, which are almost uniformly arranged on the conditioning arm such that if conditioning arm 104 contacts polishing pad 102, abrasive particles 108 engage with a substantial portion of the polishing pad.

Before conditioning sub-assembly 100 of FIG. 1A begins conditioning of polishing pad 102 (the process of conditioning a polishing pad is hereinafter referred to as "pad conditioning"), conditioning arm 104 is lowered automatically to contact a polishing pad 102, which may be rotating or in orbital state. A pneumatic cylinder (not shown to simplify illustration) may then apply a downward force on conditioning arm 104 such that abrasive particles 108 contact and engage with a substantial portion of polishing pad 102. During pad conditioning, conditioning arm 104 pivots on pivoting end 106 and sweeps back and forth across polishing pad 102 like a "windshield wiper blade" from a first position 104' (shown by dashed lines) at one end of the polishing pad to a second position 104" (shown by dashed lines) at the other end of the polishing pad. This mechanical action of conditioning arm 104 allows abrasive particles 108 to break up and remove the glazed or accumulated particles coated on the polishing pad surface.

Furthermore, the mechanical action of conditioning arm 104 also facilitates the formation of grooves or perforations on polishing pad 102. Although polishing pad 102 can be provided with grooves or perforations for slurry distribution and improved pad-wafer contact, the effectiveness of such grooves is reduced over time due to normal polishing. The pad conditioning process thus serves to reintroduce grooves or roughen the pad surface. Grooves produced during pad conditioning facilitate the polishing process by creating point contacts between the wafer surface and the pad, increase the pad roughness and allow more slurry to be applied to the substrate per unit area. Accordingly, the grooves generated on a polishing pad during conditioning increase and stabilize the wafer polishing rate.

Unfortunately, the current pad conditioning process suffers from several drawbacks. By way of example, the sweeping action of the conditioning arm across the polishing pad distributes the mechanical action of the abrasive particles almost uniformly throughout the polishing pad surface, without any particular attention to that part of the polishing pad where the wafer specifically undergoes CMP. The part of the polishing pad that actually contacts the wafer during CMP, however, may need concentrated conditioning that is not provided by the sweeping action of the conditioning arm. By way of example, in a CMP apparatuses AvantGaard 676 and 776, commercially available from Integrated Process Equipment Corporation, of Phoenix, Ariz., the center region of the polishing pad, which actually contacts the wafer during CMP, needs concentrated conditioning. Therefore, according to conventional conditioning processes, parts of the polishing pad, which normally contact the wafer during CMP, are not effectively conditioned leading to lower material removal rates and non-uniform polishing of the wafer surface. Furthermore, over conditioning of the pad to compensate also shortens the life of the polishing pad, which are expensive. In a typical wafer fabrication facility, where several CMP apparatus are employed, the replacement cost of polishing pads can be a significant expense.

What is therefore needed is an improved apparatus and process for pad conditioning that provides higher material removal rates and uniform polishing of the wafer surface.

SUMMARY OF THE INVENTION

To achieve the foregoing, the present invention provides a conditioning wafer for conditioning a polishing pad employed in chemical-mechanical polishing of an integrated circuit substrate. The conditioning wafer includes a disk having a conditioning surface and a plurality of abrasive particles secured on the conditioning surface of the disk. Furthermore, the abrasive particles engage with the polishing pad when the conditioning wafer contacts the polishing pad during conditioning of the polishing pad.

The disk may be made from a rigid material, in a preferred embodiment, however, it may be made from stainless steel. The conditioning surface of the disk may be substantially shaped as the integrated circuit substrate that undergoes polishing and the abrasive particles may be secured directly thereon. The plurality of abrasive particles on the disk may form a shape that is selected from the group consisting of rectangle, square and star pattern. Alternatively, the plurality of abrasive particles may be arranged to cover substantially all of the conditioning surface of the disk. The abrasive particles may include at least one of diamond or silicon carbide. The conditioning wafer may further include an adhesive strip that includes the abrasive particles on a first surface and adheres to the disk at a second surface. The adhesive strip may have a thickness that varies along the length of the strip. By way of example, the adhesive strip may be thicker in a middle region than side regions.

In another aspect, the present invention provides an abrasive strip for facilitating pad conditioning. The abrasive strip includes a body having a thickness that varies along a length of the strip and a first surface configured for attachment to a conditioning surface of a conditioning wafer. The abrasive strip further includes a plurality of abrasive particles disposed on a second surface of the body and-capable of engaging with a polishing pad to effectively condition the polishing pad.

In one embodiment of the present invention, the middle region of the body may be thicker than side regions of the strip. By way of example, the middle region is thicker than the side regions of the body by about 100%. The middle region may have a thickness that is between about 1 and about 4 mm and the side regions may have a thickness that is between about 0.5 and about 2 mm. The body may include a polymeric or composite material. The body may have one shape selected from the group consisting of a square, a circle, a triangle, a rectangle or a star pattern. The plurality of abrasive particles on the second surface may form a shape that is selected from the group consisting of rectangle, square and star pattern. Alternatively, the plurality of abrasive particles may be arranged to cover substantially all of the second surface of the body. The abrasive particles may include at least one of diamond or silicon carbide.

In yet another aspect, the present invention provides a conditioning process for a polishing pad. The conditioning process includes retrieving a conditioning wafer and conditioning the polishing pad by contacting the polishing pad with the conditioning wafer for a predetermined period of time. The conditioning wafer further includes a disk having a conditioning surface and a plurality of abrasive particles secured on the conditioning surface of the disk, wherein the abrasive particles engage with the polishing pad when the conditioning wafer contacts the polishing pad during conditioning of the polishing pad.

The conditioning process may further include securing the conditioning wafer on a wafer carrier or a robotic arm. The conditioning process may further still include recording at least one location on the polishing pad of a production substrate undergoing chemical-mechanical polishing. The step of may be facilitated by a computer system. The step of conditioning may be carried out on the polishing pad at substantially the same location(s). The step of retrieving may include using a vacuum wand to retrieve the conditioning wafer from a conditioning wafer cassette. The step of conditioning facilitates high material removal rates of a production substrate surface layer undergoing chemical-mechanical polishing and uniform polishing of the production substrate surface layer. The predetermined period of time may be between about 10 seconds to about 1 minute, preferably it may be about 30 seconds.

In yet another aspect, the present invention provides a chemical-mechanical polishing apparatus including a conditioning subassembly for conditioning a polishing pad used to polish an integrated circuit. The apparatus includes a platen which is capable of rotating or being put in an orbital state and securing the polishing pad, a conditioning wafer placed in a predetermined location, means for holding a conditioning wafer during conditioning of the polishing pad. The conditioning wafer further includes a disk having a conditioning surface and a plurality of abrasive particles secured on the conditioning surface of the disk, wherein the abrasive particles engage with the polishing pad when the conditioning wafer contacts the polishing pad during conditioning of the polishing pad. The means for holding the conditioning wafer may include at least one of vacuum wand or robotic arm.

The present invention represents a marked improvement over the conventional pad conditioning processes. By way of example, the part of the polishing pad that actually contacts the wafer during CMP receives the necessary concentrated conditioning. This translates into increased material removal rates for the CMP process and produces a more uniformly polished wafer surface. Pad conditioning according to the present invention also prolongs the life of the polishing pad considerably and lowers the replacement cost of polishing pads in a integrated circuit fabrication facility.

As a further example, the conditioning wafer of the present invention more vigorously conditions certain areas within the contact portion of the pad surface than other areas. By increasing the thickness in one or more regions of the abrasive strip, a higher pressure is exerted by the abrasive particles on those areas of the polishing pad surface that contact the thicker regions of the strip. Thus, the conditioning wafer of the present invention provides the flexibility of conditioning a particular area of the polishing pad surface more vigorously than the other areas.

Further still, the present invention replaces the conventionally employed complex conditioning subassembly with a simple design of a conditioning wafer. By utilizing the existing CMP apparatus, the conditioning process of the present invention using a conditioning wafer effectively conditions a polishing pad.

DETAILED DESCRIPTION OF THE PREFERRED EMBODIMENTS

The present invention provides a conditioning wafer and an automatic polishing pad conditioning process using the conditioning wafer. In the following description, numerous specific details are set forth in order to fully illustrate a preferred embodiment of the present invention. It will be apparent, however, that the present invention may be practiced without limitation to some specific details presented herein.

Figure 1A:
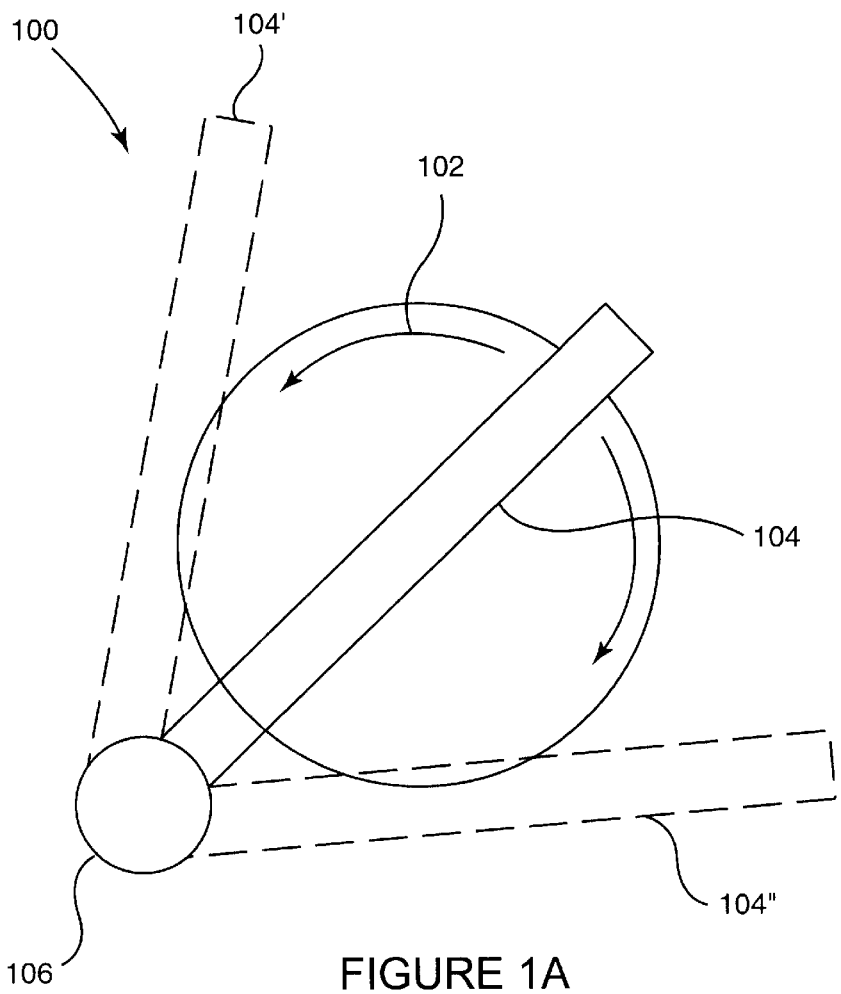
FIG. 1A shows a top view of a conditioning sub-assembly conventionally employed to condition a polishing pad.
Figure 1B:
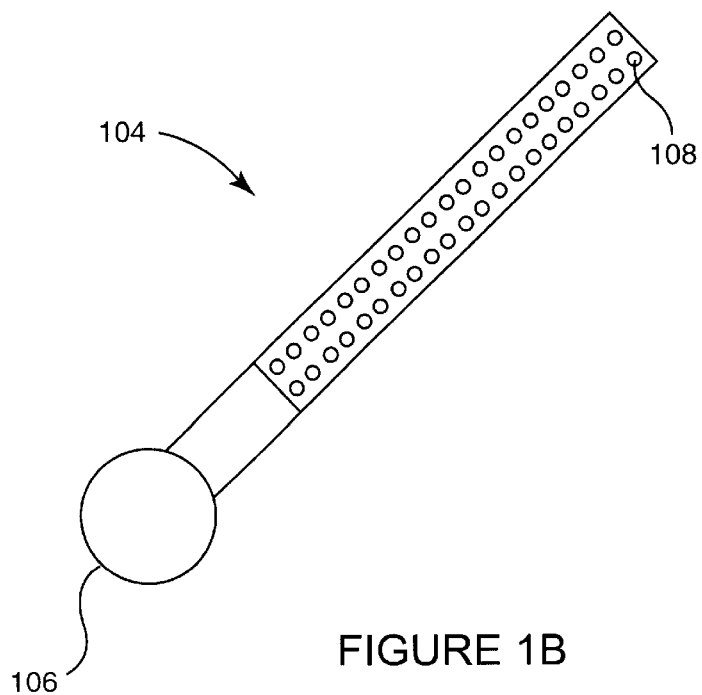
FIG. 1B shows a bottom view of the conditioning arm of the conditioning sub-assembly of FIG. 1A.
Figure 2A:
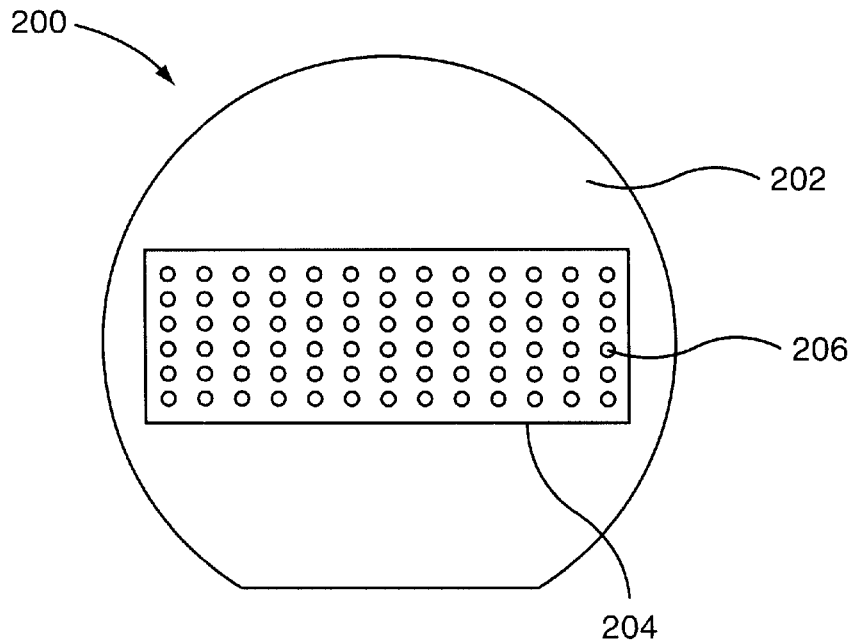
FIG. 2A shows a top view of a surface of a conditioning wafer, according to one embodiment of the present invention, including abrasive particles on a strip that is positioned at about a middle region of a disk.

FIG. 2A shows a conditioning wafer, according to one embodiment of the present invention. Conditioning wafer 200 includes a rigid disk 202, which has adhering to it an adhesive abrasive strip 204 including a plurality of abrasive particles 206.

Disk 202 may be made of any rigid material and may be of any suitable shape. In preferred embodiments, however, disk 202 of the present invention is made from a metallic material, such as stainless steel and shaped like a semiconductor wafer. Furthermore, in this embodiment, the dimensions of disk 202 may approximate that of a production substrate. As used in connection with the description of this invention, the term "production substrate" means an integrated circuit substrate of a production lot that may ultimately be sold. By way of example, in preferred embodiments, if the production substrate is a 200 mm wafer, then disk 202 of the present invention may also have an approximately 200 mm diameter and be shaped approximately like the production substrate. As will be explained later, similarity of dimensions and shape between disk 200 and production substrate allow the conditioning wafer 200 to be secured in a same wafer carrier that holds the production substrate during CMP.

Abrasive particles 206 may be made from any suitable abrasive materials well known to those skilled in the art. For pad conditioning in oxide CMP, abrasive particles 206 preferably include diamond particles. A diameter of such particles may be between about 5 and about 8 mils. In an alternative embodiment, abrasive particles 206 may include other hard materials, such as silicon carbide. Abrasive particles 206 may be secured on disk 206 in many ways. In one embodiment, abrasive particles 206 of the present invention are fabricated directly on a surface of disk 200, without the need of strip 204, using conventional techniques well known to those skilled in the art. By way of example, abrasive particles 206 may be initially embedded on or fixed to a surface on disk 202 and then disk 202 including abrasive particles 206 undergoes nickel plating to effectively secure the abrasive particles to the disk. In this embodiment, abrasive particles 206 may be substantially uniformly arranged to form any geometrical shape, such as a square, circle, triangle, rectangle, a "star" pattern. Further still, abrasive particles 206 may be fabricated by the method mentioned above to cover a substantial portion of disk 202.

Alternatively, as a further example, abrasive particles 206 may be secured on disk 202 by means of an adhesive abrasive strip 204, as shown in FIG. 2A. In this embodiment, the abrasive particles are fabricated directly on one surface of strip 204, which has an adhesive material, e.g., glue or epoxy, on the other surface. Those skilled in the art will recognize that there are many ways and various materials that can be employed to effectively affix strip 204 to disk 202. By way of example, the adhesive material may be applied to disk 204 directly and strip 204 is then firmly pressed on disk 204.

Strip 204 may be made from various well known polymeric or composite materials. By way of example, strip 204 of the present invention includes a diamond embedded tape that may be commercially available from Marshall Laboratories of Marshall, Minn. Strip 204 may be manufactured in various shapes so long as it effectively exposes an appropriate amount of abrasive particles to the polishing pad for effective pad conditioning. By way of example, strip 204 may be rectangular, square or shaped like a star pattern, etc. As a further example, strip 204 may be shaped similar to disk 202, however, slightly smaller in size than disk 202 such that after affixing the abrasive strip to the disk surface, conditioning wafer 200 has abrasive particles disposed on a substantial portion of the conditioning wafer surface. Alternatively, strip 204 may be a square, circular or rectangular piece, on which abrasives 206 are substantially uniformly arranged.

Figure 2B:
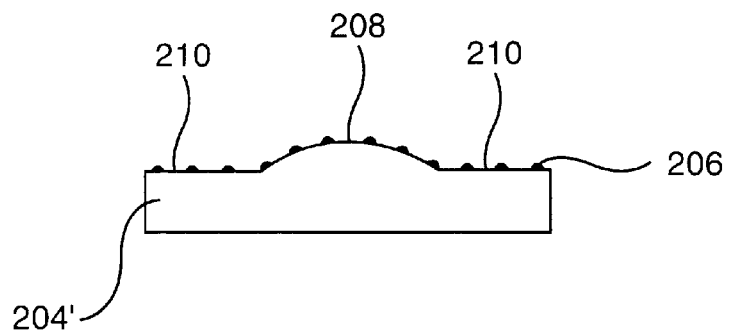
FIG. 2B is a side cross-sectional view of the strip of FIG. 2A showing a middle region that is relatively thicker than side regions.

In one embodiment of the present invention, the abrasive strip may be of substantially uniform thickness. In an alternative embodiment, however, the abrasive strip of the present invention may have a thickness that varies along a length of the strip. By way of example, FIG. 2B is a cross-sectional side view of a strip 204' that may have a thickness that varies along the length of the strip. In this embodiment, a middle region 208 of the strip is thicker than the side regions 210. As used in connection with the description of this invention, the term "side region" means a part of the abrasive strip that excludes the middle region or is outside the middle region of the strip.

When a conditioning wafer of the present invention is formed by affixing strip 204' to disk 202 of FIG. 2A, middle region 208 of strip 204' may be positioned about the middle region of the conditioning wafer. Thus, the conditioning wafer formed by employing strip 204' may have a protrusion or a bump about its middle region. In this configuration, during pad conditioning, the middle region of the conditioning wafer exerts a higher pressure on the polishing pad than the other regions, e.g., side regions 210, of the conditioning wafer. Consequently, the part of the polishing pad surface that contacts the middle region of the conditioning wafer receives more vigorous conditioning than the other areas on the polishing pad surface.

Those skilled in the art will recognize that the location of the thicker regions of the abrasive strip on the conditioning wafer can be varied depending on the areas of the polishing pad that require vigorous conditioning. By way of example, in the CMP apparatuses AvantGaard 676 and 776 (mentioned above), the center region of the polishing pad, which actually contacts the wafer during CMP, needs vigorous conditioning. It is, therefore, preferable to position the conditioning wafer, including abrasive strip 204', near the center region of the polishing pad such that the thicker middle region of the abrasive strip may contact the center region of the pad and thereby vigorously condition the pad. Of course in the embodiment where no abrasive strip is involved and the abrasive particles are fabricated directly on the disk, the thickness of the disk may be varied to provide vigorous conditioning.

Referring back to FIG. 2B, side regions 210 of abrasive strip 204' have a thickness that is between about 0.5 and about 2 mm. The thickness of abrasive strip 204' in middle region 208 may be increased depending on the extent of vigorous pad conditioning that is necessary. It is preferable, however, to increase the thickness by at least about 100%. Thus, in a preferred embodiment the thickness of the middle region may be at least between about 1 and about 4 mm.

Figure 2C:
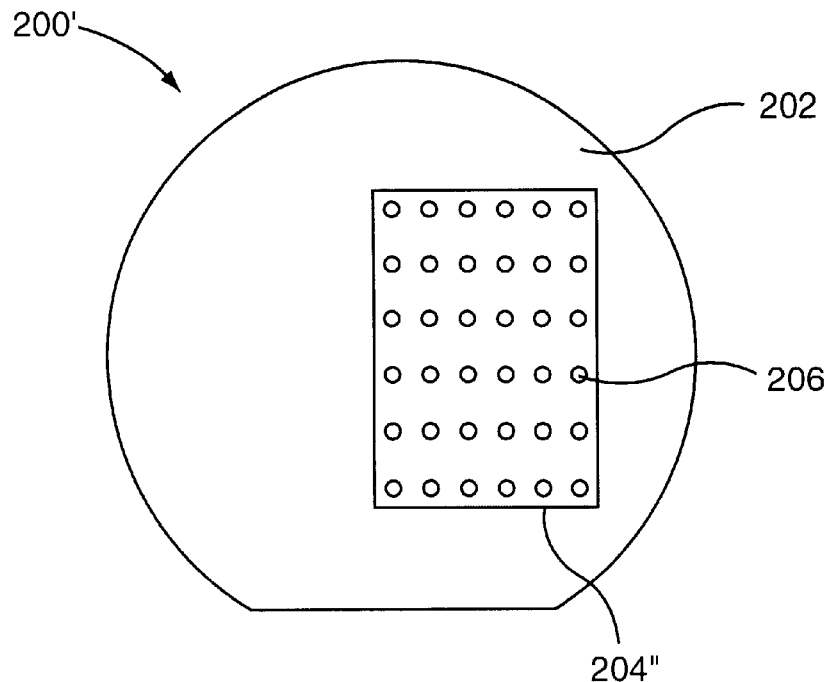
FIG. 2C shows a top view of a surface of a conditioning wafer, according to an alternative embodiment of the present invention, including abrasive particles on a strip that is positioned at one side of the disk.
Figure 2D:
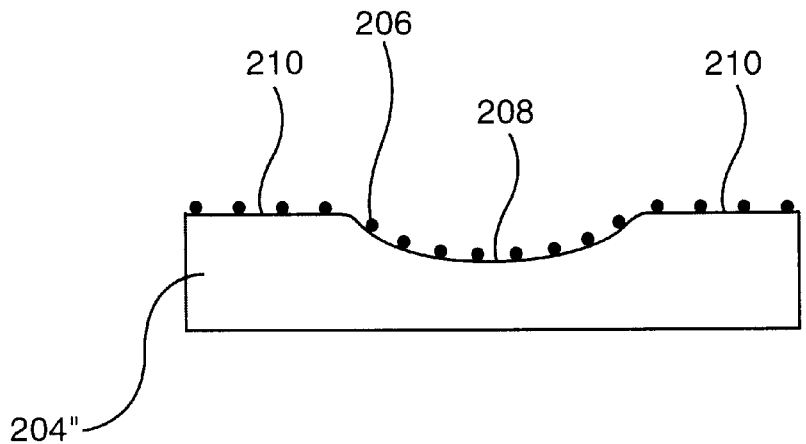
FIG. 2D is a side cross-sectional view of a surface of the strip of FIG. 2C showing side regions that are relatively thicker than the middle regions.

FIG. 2C shows a conditioning wafer 200', according to an alternative embodiment of the present invention, where a strip 204'' having abrasive particles 206 are positioned at one side region of a disk 206, as opposed to the middle region of the disk shown in FIG. 2A. Furthermore, according to FIG. 2D, strip 204" may have a thickness that varies along the length of the strip, i.e. side regions 210 are relatively thicker than middle region 208. During conditioning, therefore, abrasive particles 206 apply a stronger force on a part of the polishing pad that contacts side regions 210 of strip 204". In this configuration, a different part of the conditioning wafer provides a more vigorous conditioning action. Thus, the conditioning wafer of the present invention provides the flexibility of conditioning a particular area of the polishing pad surface more vigorously than the other areas.

Figure 3:
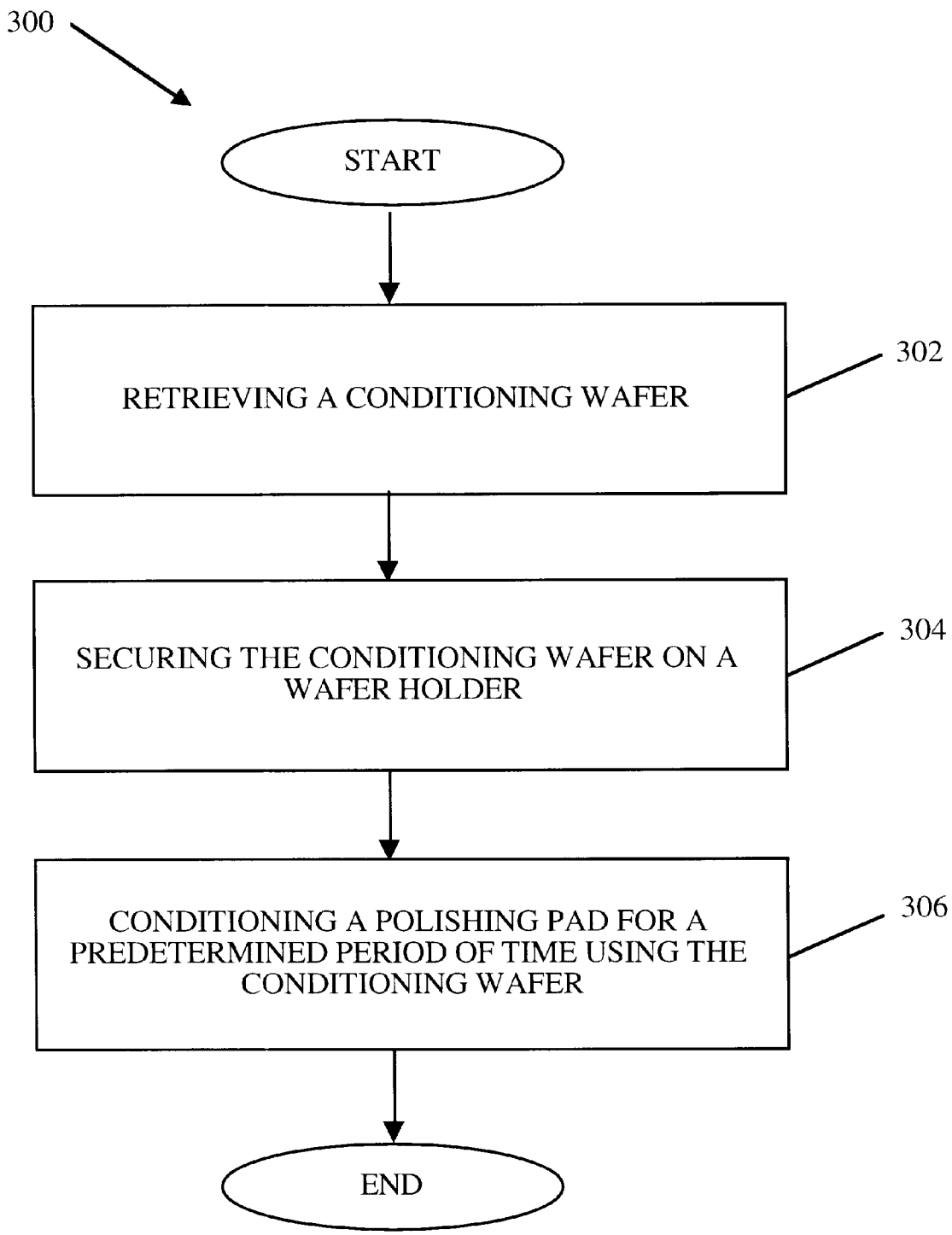
FIG. 3 is a flow chart of a pad conditioning process, according to one embodiment of the present invention.

FIG. 3 depicts important steps in a pad conditioning process 300, according to one preferred embodiment of the present invention. Pad conditioning process 300 may be implemented during production substrate CMP, i.e. pad conditioning and production substrate CMP are carried out simultaneously, or after CMP of a production substrate has concluded. In the case where pad conditioning is carried out after production substrate CMP, a motor current measuring mechanism and visual inspection systems well known to those skilled in the art may be employed to determine the CMP endpoint before pad conditioning process 300 begins. In one preferred embodiment, before pad conditioning process 300 of the present invention may be implemented, information regarding the location(s) where the production substrate actually contacts the polishing pad during CMP are recorded and stored in a computer system. As will be explained later, in subsequent steps of pad conditioning process 300, this location of the polishing pad is conditioned with particular attention.

A step 302 includes retrieving a conditioning wafer, which may be stored in a predetermined location, e.g., a conditioning wafer cassette. According to the present invention, a conditioning wafer cassette, similar to a conventional wafer cassette, has various slots that are capable of holding one or more conditioning wafers. The conditioning wafer retrieved in this step preferably includes the conditioning wafer of the present invention. There are many number of ways to retrieve the conditioning wafer, e.g., employing a vacuum wand or a robotic arm. By way of example in the chemical-mechanical apparatuses Avant-Gaard 676 and 776, a vacuum wand retrieves a production substrate from a wafer cassette by holding the production substrate from its active surface.

A step 304 includes securing the conditioning wafer of step 302 on a wafer holder or carrier. In this step, the wafer carrier that secures the production substrate during CMP may be employed. By way of example, in the CMP apparatuses AvantGaard 676 and 776, the vacuum wand after retrieving the conditioning wafer places the wafer in position to be secured by the wafer carrier. In the embodiment where pad conditioning is carried out simultaneously with the production substrate CMP, the conditioning wafer may be secured by the same or another robotic arm depending on the CMP apparatus employed.

Next, a step 306 includes pad conditioning using the conditioning wafer for a predetermined period of time. Before pad conditioning begins, however, the secured conditioning wafer is lowered automatically to contact the polishing pad, which is rotating or is in orbital state typically by means of a table motor. During pad conditioning, a pneumatic cylinder may apply a downward force, ensuring that the abrasive particles of the conditioning wafer engage with the polishing pad. The pressure applied on the conditioning wafer may generally range from between about 1 to about 5 psi. In the embodiments shown in FIGS. 2B and 2D, where the thickness of the abrasive strip varies along the length of the strip, the pressure on the conditioning wafer may preferably range from between about 2 to about 4 psi. The conditioning wafer preferably rotates, like the production substrate rotates during CMP, on the polishing pad. In order to effectively condition the entire pad surface, the rotating conditioning wafer may automatically move around between the various locations of the pad by electronic control systems.

In another embodiment of step 306, the conditioning wafer is lowered to contact the polishing pad in the same or approximately the same location(s) where the production substrate contacted the polishing pad during CMP (as opposed to moving the conditioning wafer in an independent path). As mentioned above, in a preferred embodiment of the present invention, information regarding the location(s) of the production substrate on the polishing pad during CMP was stored before pad conditioning process 300 was implemented. Furthermore, it should be kept in mind that in the preferred embodiments of the present invention, the conditioning wafer, having substantially the same features (e.g., size and shape) as the production substrate, mimics the action of the production substrate on the polishing pad during pad conditioning. Thus, the part of the polishing pad, which is used the most during CMP receives the necessary concentrated conditioning.

The predetermined period of time in step 306 may be any length of time that is necessary to effectively condition the polishing pad. It may generally range between about 10 seconds to about one minute. In a preferred embodiment however, the predetermined period of time may be about 30 seconds.

After pad conditioning process 300 has concluded, the conditioning wafer may be automatically removed from the polishing pad and stored in the predetermined location, such as the conditioning wafer cassette. This may be facilitated by the same vacuum wand or robotic arm employed in step 302. The movement of the vacuum wand or robotic arm may be monitored by a computer system. For subsequent conditioning, the same conditioning wafer or another conditioning wafer from the conditioning wafer cassette may be retrieved and steps 302 to steps 306 may be repeated.

Suitable computer systems for use in implementing and controlling the automated methods of the present invention may be obtained from various vendors. In one preferred embodiment, an appropriately programmed HP 735 workstation (Hewlett Packard, Palo Alto, Calif.), Sun ULTRASPARC or Sun SPARC (Sun Microsystems, Sunnyvale, Calif.), or well known PC based systems.

It should be understood that the present invention also relates to machine readable media on which are stored instructions for implementing the invention. Such instructions may provide appropriate instructions for movements of vacuum wand, robotic arm(s), wafer carrier, movement of the conditioning wafer on the polishing pad, storing the location of the production substrate during CMP, etc. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

The present invention represents a marked improvement over the conventional pad conditioning processes. By way of example, the part of the polishing pad that actually contacts the wafer during CMP receives the necessary concentrated conditioning. This translates into increased material removal rates for the CMP process and produces a more uniformly polished wafer surface. Pad conditioning according to the present invention also prolongs the life of the polishing pad considerably and lowers the replacement cost of polishing pads in a integrated circuit fabrication facility.

As a further example, the conditioning wafer of the present invention more vigorously conditions certain areas within the contact portion of the pad surface than other areas. By increasing the thickness in one or more regions of the abrasive strip, a higher pressure is exerted by the abrasive particles on those areas of the polishing pad surface that contact the thicker regions of the strip. Thus, the conditioning wafer of the present invention provides the flexibility of conditioning a particular area of the polishing pad surface more vigorously than the other areas.

Further still, the present invention replaces the conventionally employed complex conditioning subassembly with a simple design of a conditioning wafer. By utilizing the existing CMP apparatus, the conditioning process of the present invention using a conditioning wafer effectively conditions a polishing pad.

Although the foregoing invention has been described in some detail for purposes of clarity of understanding, it will be apparent that certain changes and modifications may be practiced within the scope of the appended claims. For example, while the specification has described the pad conditioning processes and apparatuses to be used in the context of chemical-mechanical polishing, there is no reason why in principle such pad conditioning processes and apparatuses could not be used to condition a polishing pad used in other polishing applications. Therefore, the present embodiments are to be considered as illustrative and not restrictive, and the invention is not to be limited to the details given herein, but may be modified within the scope of the appended claims.

What is claimed is:

1. A conditioning wafer for conditioning a polishing pad employed in chemical-mechanical polishing of an integrated circuit substrate, comprising:
   a disk having a conditioning surface; and
   an adhesive strip that includes abrasive particles on a first surface and adheres to the conditioning surface of the disk at a second surface, wherein said abrasive particles engage with the polishing pad when said conditioning wafer contacts said polishing pad during conditioning of said polishing pad.

2. The conditioning wafer of claim 1, wherein the disk comprises a rigid material.

3. The conditioning wafer of claim 2, wherein the disk is made from stainless steel.

4. The conditioning wafer of claim 1, wherein the conditioning surface of the disk is substantially shaped as the integrated circuit substrate.

5. The conditioning wafer of claim 1, wherein the plurality of abrasive particles on the disk form a shape that is selected from the group consisting of rectangle, square and star pattern.

6. The conditioning wafer of claim 1, wherein the plurality of abrasive particles cover substantially all of the conditioning surface of the disk.

7. The conditioning wafer of claim 1, wherein the abrasive particles comprise at least one of diamond or silicon carbide.

8. The conditioning wafer of claim 1, wherein the adhesive strip has a thickness that varies along the length of the strip by at least about 100%.

9. The conditioning wafer of claim 8, wherein the adhesive strip is thicker in a middle region than side regions.

10. An abrasive strip for facilitating pad conditioning, comprising:
    a body having a thickness that varies along a length of said strip and a first surface configured for attachment to a conditioning surface of a conditioning wafer; and
    a plurality of abrasive particles disposed on a second surface of said body and capable of engaging with a polishing pad to effectively condition said polishing pad.

11. The abrasive strip of claim 10, wherein a middle region of the body is thicker than side regions of the strip.

12. The abrasive strip of claim 11, wherein the middle region is thicker than the side regions of the body by about 100%.

13. The abrasive strip of claim 10, wherein the middle region has a thickness that is between about 1 and about 4 mm.

14. The abrasive strip of claim 10, wherein the side regions have a thickness that is between about 0.5 and about 2 mm.

15. The abrasive strip of claim 10, wherein the body comprises a polymeric or composite material.

16. The abrasive strip of claim 10, wherein the body may have one shape selected from the group consisting of a square, a circle, a triangle, a rectangle or a star pattern.

17. The abrasive strip of claim 10, wherein the plurality of abrasive particles on the second surface form a shape that is selected from the group consisting of rectangle, square and star pattern.

18. The abrasive strip of claim 10, wherein the plurality of abrasive particles cover substantially all of the second surface of the body.

19. The abrasive strip of claim 10, wherein the abrasive particles comprise at least one of diamond or silicon carbide.

20. A conditioning process for a polishing pad, comprising:
    retrieving a conditioning wafer and using a wafer carrier configured to hold either one of a conditioning wafer and an integrated circuit substrate, said conditioning wafer including:
       a disk having a conditioning surface; and
       a plurality of abrasive particles secured on said conditioning surface of said disk, wherein said abrasive particles engage with the polishing pad when said conditioning wafer contacts said polishing pad during conditioning of said polishing pad; and
    conditioning said polishing pad by contacting the polishing pad with the conditioning wafer for a predetermined period of time.

21. The conditioning process of claim 20, further comprising securing the conditioning wafer on a wafer carrier or a robotic arm.

22. The conditioning process of claim 20, further comprising recording at least one contact location on the polishing pad of a production substrate undergoing chemical-mechanical polishing.

23. The conditioning process of claim 22, wherein the step of recording is facilitated by a computer system.

24. The conditioning process of claim 22, wherein said step of conditioning is carried out on the polishing pad at substantially the at least one location.

25. The conditioning process of claim 20, wherein said step of retrieving comprises using a vacuum wand to retrieve the conditioning wafer from a conditioning wafer cassette.

26. The conditioning process of claim 20, wherein said step of conditioning facilitates high material removal rates of a production substrate surface layer undergoing chemical-mechanical polishing and uniform polishing of the production substrate surface layer.

27. The conditioning process of claim 20, wherein the predetermined period of time is between about 10 seconds to about 1 minute.

28. The conditioning process of claim 27, wherein the predetermined period of time is about 30 seconds.

29. A chemical-mechanical polishing apparatus including a conditioning subassembly for conditioning a polishing pad used to polish an integrated circuit substrate, comprising:
- a platen which is capable of rotating or being put in an orbital state and securing said polishing pad;
- a conditioning wafer placed in a predetermined location, said conditioning wafer including:
  - a disk having a conditioning surface; and
  - a plurality of abrasive particles secured on said conditioning surface of said disk, wherein said abrasive particles engage with said polishing pad when said conditioning wafer contacts said polishing pad during conditioning of said polishing pad; and
- a wafer carrier configured to hold either one of a conditioning wafer and an integrated circuit substrate.

30. The chemical-mechanical polishing apparatus of claim 29, wherein said means for holding said conditioning wafer comprises at least one of vacuum wand or robotic arm.

31. The chemical-mechanical polishing apparatus of claim 29, wherein said disk is made from stainless steel.

32. The chemical-mechanical polishing apparatus of claim 29, wherein the conditioning surface of the disk is substantially shaped as the integrated circuit substrate.

33. The chemical-mechanical polishing apparatus of claim 29, wherein the adhesive strip has a thickness that varies along the length of the strip.

34. The chemical-mechanical polishing apparatus of claim 33, wherein a middle region of the strip is thicker than side regions of the strip by about 100%.

* * * * *